United States Patent [19]

Dietz

[11] 4,301,394
[45] Nov. 17, 1981

[54] HORIZONTAL DEFLECTION CIRCUIT AND POWER SUPPLY WITH REGULATION BY HORIZONTAL OUTPUT TRANSISTOR TURN-OFF DELAY CONTROL

[75] Inventor: Wolfgang F. W. Dietz, New Hope, Pa.

[73] Assignee: RCA Corporation, New York, N.Y.

[21] Appl. No.: 98,255

[22] Filed: Nov. 28, 1979

[51] Int. Cl.³ .................... H01J 29/70; H01J 29/76
[52] U.S. Cl. .................................... 315/408; 315/411
[58] Field of Search ............... 315/408, 409, 410, 411

[56] References Cited

U.S. PATENT DOCUMENTS

| | | | |
|---|---|---|---|
| 3,983,451 | 9/1976 | Leis et al. | 315/387 |
| 4,071,810 | 1/1978 | Dobbert | 315/400 |
| 4,146,823 | 3/1979 | Dietz | 315/408 |

Primary Examiner—Theodore M. Blum
Attorney, Agent, or Firm—Eugene M. Whitacre; Paul J. Rasmussen; Joseph J. Laks

[57] ABSTRACT

A horizontal deflection circuit of a television receiver includes a horizontal deflection winding, a retrace capacitor and a trace switch comprising a damper diode and a horizontal output transistor. A horizontal oscillator provides a synchronized deflection rate square-wave voltage to a base-drive generator circuit for the horizontal output transistor. The base-drive generator circuit develops a forward biasing portion of the horizontal output transistor base-drive signal to maintain the transistor in saturated conduction during the latter portion of trace. The generator also develops a reverse biasing portion to initiate horizontal retrace after the output transistor collector current is cut off. A lapse of a turn-off delay time occurs from the initiation of the reverse biasing portion of the base-drive signal to the collector current cutoff instant.

Energy is transferred from an unregulated input supply to television receiver load circuits through an inductance such as a flyback transformer. A controllable switch is coupled to the inductance. The switch is turned on within each deflection cycle to enable energy from the unregulated input supply to be stored in the inductance during the latter portion of the trace interval. A retrace pulse voltage applied to the inductance initiates the energy transfer interval. To regulate the energy transfer, the turn-off delay time of the horizontal output transistor is controlled, thereby controlling the initiation of the retrace and energy transfer interval.

10 Claims, 3 Drawing Figures

HORIZONTAL DEFLECTION CIRCUIT AND POWER SUPPLY WITH REGULATION BY HORIZONTAL OUTPUT TRANSISTOR TURN-OFF DELAY CONTROL

This invention relates to regulated deflection circuits for television receivers.

In typical television receiver horizontal deflection circuits, a deflection generator trace switch is coupled across the series arrangement of a horizontal deflection winding and a trace capacitor. When the trace switch is conductive, the capacitor trace voltage is applied across the deflection winding to generate a sawtooth scanning or trace deflection current in the deflection winding. After the trace switch becomes nonconductive, the horizontal deflection winding and a retrace capacitor form a resonant retrace circuit to generate a retrace pulse voltage and a retrace deflection current in the horizontal deflection winding.

The retrace pulse voltage developed across the horizontal deflection winding is applied to a winding of a horizontal output or flyback transformer to be used in developing auxiliary supply voltages for the television receiver. For example, a high voltage or ultor accelerating potential is developed from the retrace pulse voltage developed in a high voltage winding of the flyback transformer. Lower voltage trace and retrace rectified supply voltages power other circuits such as the video, vertical and audio circuits.

Energy to power the auxiliary supply load circuits and to replenish losses occurring within the deflection generator is typically obtained from an AC power line or mains supply coupled to a winding of the flyback transformer, with the flyback transformer functioning as the energy transfer mechanism from the mains supply to the load circuits. To control the amount of energy transferred, some television receiver power supply circuits interpose a switching regulator circuit between the unregulated input voltage terminal of the mains supply and the flyback transformer. The regulator circuit includes a controllable switch which may be operated at the 15.75 KHz horizontal deflection rate. A pulse modulator control circuit provides pulse-modulated signals to the controllable switch to vary the turn-on time of the switch. Such a control circuit is of relatively complicated design and if constructed with discrete electrical components may be relatively costly to construct.

Some pulse modulator control circuits may be designed to be fabricated as an integrated circuit. Such an integrated circuit may also incorporate the horizontal oscillator and automatic frequency and phase control circuits. By combining the function of regulator switch control and horizontal oscillator operation in one integrated circuit package, design flexibility of the total deflection and power supply circuit is reduced in that a different switching regulator output stage or a different horizontal output transistor driver stage may be required for each integrated circuit which incorporates a different horizontal oscillator circuit or a different regulator control circuit.

In an inventive arrangement, energy from a voltage source is first stored in an inductance such as a flyback transformer. The storage and energy transfer is regulated by varying the cutoff instant of the trace switch or horizontal output transistor. In a specific embodiment a controllable switch is included between the source and the inductance. The switch initiates the energy storage in the inductance when the switch becomes conductive.

Another feature of the invention is that by controlling the turn-off instant of the horizontal output transistor rather than the turn-on instant of the controllable switch, the complexity of the regulator circuitry may be reduced in that the base drive circuitry for the horizontal output transistor may now be combined with the controllable switch and regulator control circuitry. Regulation may be achieved using relatively simple control circuitry which does not have to be monolithically formed and which may be used in conjunction with many different types of horizontal oscillator circuits. Another feature of the invention is that pulse voltages to control the conductive states of both the controllable switch and the horizontal output transistor may be obtained from windings of a single transformer rather than using separate transformers for each of the two devices.

Figure 1:
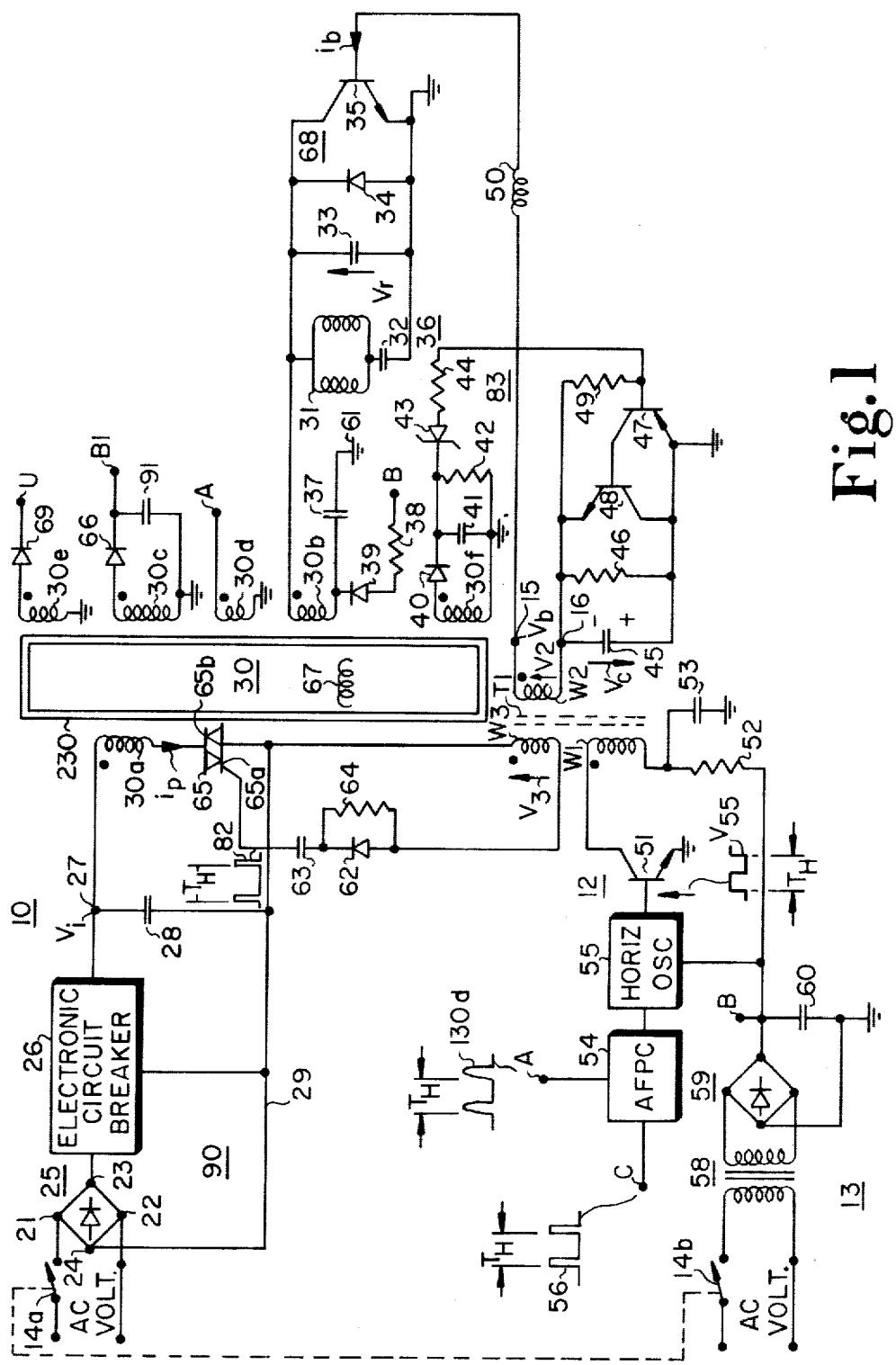
FIG. 1 illustrates a deflection and energy supply circuit embodying the invention.

In the horizontal deflection and energy supply circuit 10, illustrated in FIG. 1, a source of AC voltage is coupled through an ON/OFF switch 14a to input terminals 21 and 22 of a bridge rectifier 25 of an unregulated input supply 90. The AC voltage source may comprise, for example, the AC power line or mains supply. The AC voltage across terminals 21 and 22 is full-wave rectified by bridge rectifier 25 and filtered by a capacitor 28 to develop an unregulated DC input voltage $V_i$ at a terminal 27. Current flows from an output terminal 23 of bridge rectifier 25 to terminal 27 through a conventional electronic circuit breaker 26 which open-circuits the current path between terminals 23 and 27 under overload conditions. The return path for current flowing out of terminal 27 is along a conductor line 29 to a return terminal 24 of bridge rectifier 25.

One terminal of a primary winding 30a of a horizontal output or flyback transformer 30 is coupled to terminal 27. The other terminal of flyback transformer primary winding 30a is coupled to return conductor line 29 through a bidirectionally conductive controllable switch 65. Controllable switch 65 comprises a silicon controlled rectifier 65a and a parallel oppositely-poled diode 65b, with the cathode of SCR 65a and the anode of diode 65b being coupled to return conductor line 29.

Flyback transformer 30 is of conventional construction, with primary winding 30a wound around one leg of a rectangular core 230. Wound around the opposite leg of rectangular core 230 are five windings 30b, 30c, 30d, 30e and 30f. The windings 30b–30f may be concentrically wound and are thus magnetically tightly coupled.

Flyback transformer winding 30b is coupled to a horizontal deflection winding 31 of a horizontal deflection generator 36. Horizontal deflection generator 36 comprises the series arrangement of horizontal deflection winding 31 and a trace capacitor 32 together with a trace switch 68 and a retrace capacitor 33. Trace switch 68 comprises a horizontal output transistor 35 and a parallel oppositely-poled damper diode 34. A terminal of flyback transformer winding 30b that is remote from horizontal deflection winding 31 is coupled to a reference or ground terminal 61 through a DC blocking capacitor 37.

Reference or ground terminal 61 is conductively isolated from the return conductor line 29 of the AC input voltage source coupled to bridge rectifier 25. Such an arrangement provides electrical shock hazard protection for all circuits, such as horizontal deflection generator 36, which use terminal 61 as a reference terminal.

Horizontal output transistor 35 is switched into and out of conduction each horizontal deflection cycle by a square-wave voltage applied to the transistor base through an inductor 50 from a synchronized horizontal oscillator and driver circuit 12. Horizontal oscillator and driver circuit 12 includes a conventional automatic frequency and phase control (AFPC) circuit 54, a conventional horizontal oscillator circuit 55 and a driver transistor 51. To provide for synchronized horizontal deflection, AFPC circuit 54 is made responsive to horizontal retrace pulses 103$d$ developed across flyback transformer winding 30$d$ and applied to the circuit at a terminal A. AFPC circuit 54 is also made responsive to horizontal sync pulses 56 applied at a terminal C and which repeat at a horizontal rate, $1/T_H$. Horizontal sync pulses 56 are obtained from a conventional sync separator, not illustrated, which separates the sync information from the picture information of the composite video signal. AFPC circuit 54 applies a control voltage to horizontal oscillator 55 to control the phase and frequency of the oscillator in a manner which synchronizes horizontal deflection with the picture and sync information.

Figure 2:
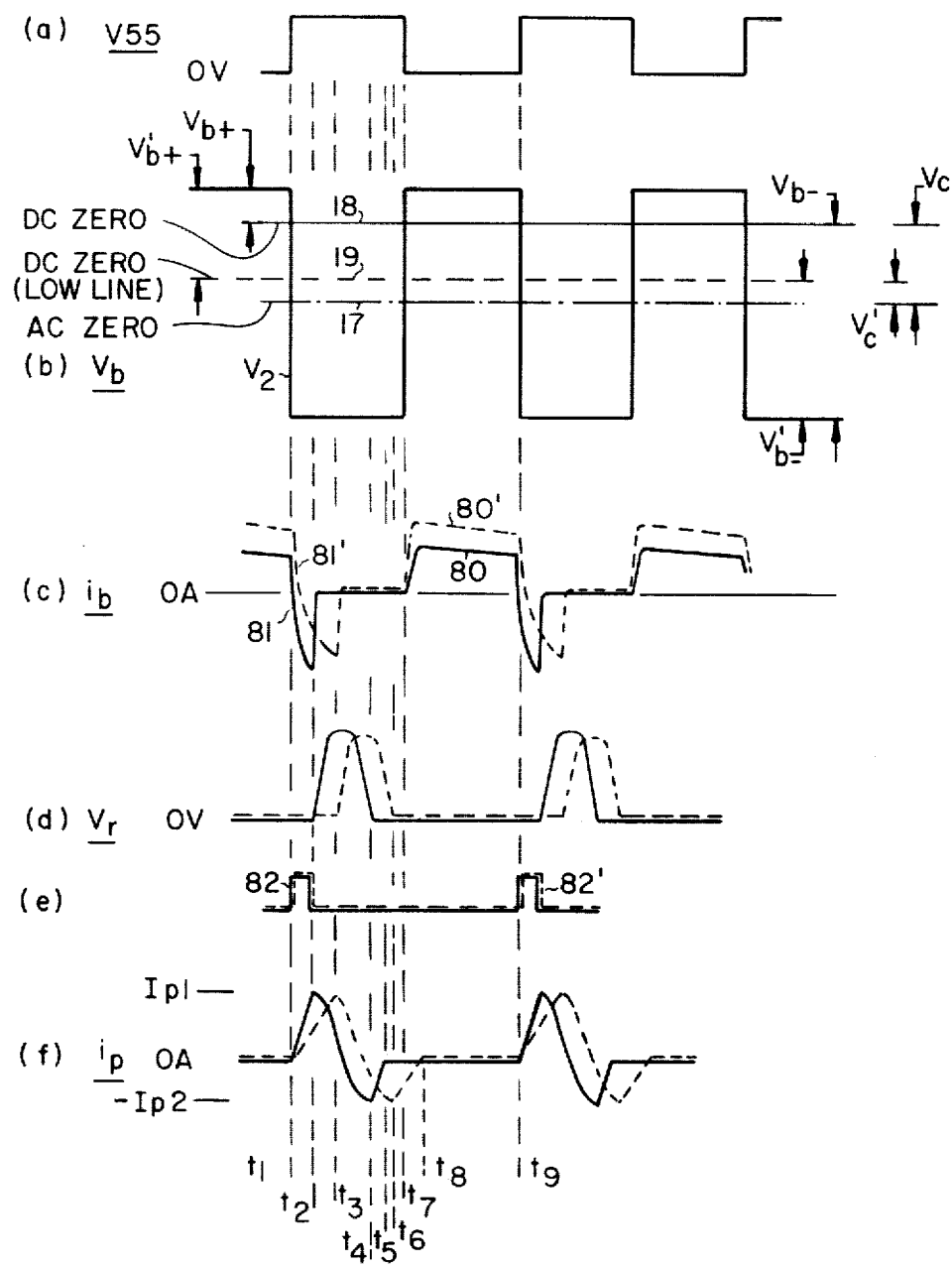
FIG. 2 illustrates waveforms associated with the circuit of FIG. 1.

Horizontal oscillator 55 develops a horizontal deflection rate square-wave voltage $V_{55}$, illustrated in FIGS. 1 and 2$a$, which is then applied to the base of driver transistor 51. The collector of driver transistor 51 is coupled to one terminal of a primary winding W1 of a driver transformer T1. The other terminal of driver transformer primary winding W1 is coupled to a low B+ supply voltage terminal B through a resistor 52. A filter capacitor 53 is coupled to the junction of winding W1 and resistor 52.

The low B+ supply voltage may be conventionally developed by a supply 13. The AC voltage source is coupled to a transformer 58 of supply 13 through an ON/OFF switch 14$b$, ganged to ON/OFF switch 14$a$, then rectified by a bridge rectifier 59 and filtered by a capacitor 60 to provide the low B+ supply voltage at terminal B.

Supply 13 provides a low B+ voltage to horizontal oscillator 55 and to the collector of driver transistor 51 during the initial interval after closure of ON/OFF switches 14$a$ and 14$b$. After sufficiently large amplitude retrace pulses are generated in flyback transformer winding 30$c$ to develop a low B+ supply voltage at a terminal B1, when rectified by a diode 66 and filtered by a capacitor 91, the supply voltage developed at terminal B1 may then be substituted by means of conventional circuitry, not illustrated, for the voltage developed at terminal B for use by horizontal oscillator 55 and driver transistor 51.

The deflection rate voltage $V_{55}$ is amplified and inverted by driver transistor 51 and applied to winding W1 of driver transformer T1 to develop an AC square-wave voltage $V_2$ across a winding W2, as illustrated in FIG. 2$b$. A terminal 15 of winding W2 is coupled to inductor 50. A terminal 16 of winding W2 is coupled to ground through a capacitor 45. A resistor 46 is coupled across capacitor 45.

During the positive portion of AC square-wave voltage $V_2$, between times $t_7$–$t_9$ of FIG. 2$b$, the base-emitter junction of horizontal output transistor 35 becomes forward biased. The junction functions as a diode to rectify the positive portion of the voltage $V_2$ to develop a DC voltage of magnitude $V_c$ across capacitor 45, with the electrode of capacitor 45 coupled to terminal 16 being at a negative voltage with respect to ground. Thus, the voltage applied across the series combination of inductor 50 and the base-emitter junction of horizontal output transistor 35 is illustrated in FIG. 2$b$ as the same waveform $V_2$, referenced, however, to a DC zero line 18 rather than the AC zero line 17 of the waveform $V_2$, with the two zero lines being offset by the capacitor voltage $V_c$.

During the positive portion $V_{b+}$ of the base-drive voltage $V_b$, illustrated in FIG. 2$b$ as the voltage $V_2$ referenced to the DC zero line 18, the current $i_b$ flowing through the base-emitter junction of horizontal output transistor 35 is illustrated in FIG. 2$c$ by the positive portion 80 of the solid waveform between times $t_7$–$t_9$. The amplitude of the positive portion of base current $i_b$ is a function of the voltage $V_c$ across capacitor 45. A smaller magnitude to the voltage $V_c$ for example will produce a larger magnitude to the voltage portion $V_{b+}$ and thus a larger amplitude to the forward base-drive current portion 80 of the base current $i_b$.

To initiate horizontal retrace, base-drive voltage $V_b$ goes negative at time $t_1$ of FIG. 2$b$. The negative or reverse biasing portion $V_{b-}$ of base-drive voltage $V_b$ extends from time $t_1$ to $t_7$. After application of the negative base-drive portion to the base of horizontal output transistor 35, a reverse base current portion 81 of the base current $i_b$ flows in the series path of inductor 50 and the base-emitter junction of horizontal output transistor 35, as illustrated by the solid waveform 81 of FIG. 2$c$ between times $t_1$–$t_2$.

Horizontal output transistor 35 remains conductive and collector current of the transistor continues to flow during the interval $t_1$–$t_2$, the initial portion of the negative portion of base-drive voltage $V_b$. As illustrated in FIG. 2$d$, the voltage at the collector of horizontal output transistor 35 or the voltage $V_r$ across retrace capacitor 33 is approximately zero during this turn-off delay interval. The transistor turn-off delay arises in part due to the presence of minority carrier stored charge in the base region of horizontal output transistor 35. Transistor 35 cannot be cut off until this base charge is removed from the base region.

The duration of the turn-off delay time is a function of such factors as the geometry and construction of the transistor, the magnitude of the forward base current portion of the current $i_b$ and the magnitude of the negative voltage portion $V_{b-}$ of the voltage $V_b$ applied to the base of horizontal output transistor 35. For example, increasing the magnitude of the forward base current portion 80 flowing prior to the application of the negative voltage to the base of horizontal output transistor 35 will increase the turn-off delay time. Similarly, decreasing the magnitude of the negative portion of the voltage $V_b$ applied to the base or horizontal output transistor 35 after time $t_1$ of FIGS. 2$b$ and 2$c$ will increase the turn-off delay time.

At time $t_2$, after lapse of the turn-off delay time, that is to say, after the stored charge has been swept out of the base region and a new charge distribution in the junction regions of horizontal output transistor 35 has been established, collector current ceases to flow in the transistor. Horizontal deflection winding 31 and retrace capacitor 33 form a resonant retrace circuit to develop a retrace pulse voltage across the deflection winding, as illustrated in FIG. 2d between times $t_2$-$t_4$. The subsequent horizontal trace interval begins at time $t_4$ when damper diode 34 begins to conduct.

To transfer energy from unregulated input supply 90 to the various load circuits coupled to flyback transformer windings 30b-30f, energy is first stored in the leakage inductance 67 of flyback transformer 30 during the latter portion of the horizontal trace interval and then transferred to the various load circuits during the horizontal retrace interval.

One terminal of a winding W3 of driver transformer T1 is coupled to the cathode of SCR 65a of bidirectionally conductive switch 65. The other terminal of winding W3 is coupled to the gate of SCR 65a through a diode 62 and a capacitor 63. A resistor 64 is coupled across diode 62. The voltage $V_3$ developed across winding W3 is similar in waveshape and in-phase with the deflection rate voltage $V_{55}$ produced by horizontal oscillator 55.

At time $t_1$, the leading or positive-going edge of the square-wave voltage $V_3$ is differentiated by diode 62 and capacitor 63 to produce a gating pulse 82, schematically illustrated in FIG. 2e, to gate SCR 65a into conduction. Due to storage time delay effects, the horizontal output transistor 35 still functions as a closed switch between times $t_1$-$t_2$, with the horizontal retrace interval not beginning until time $t_2$, the end of the previously discussed turn-off delay interval.

With SCR 65a of bidirectionally conductive switch 65 being gated into conduction at time $t_1$, the unregulated input voltage $V_i$ is applied across flyback transformer primary winding 30a at that instant. As illustrated in FIG. 2f, the primary current $i_p$ flowing in winding 30a comprises a positive sawtooth current between times $t_1$-$t_2$. During this latter portion of the trace interval, energy is being stored substantially in the leakage inductance 67 of flyback transformer 30, with the stored energy reaching a maximum value at time $t_2$, as determined by the peak current $I_{P1}$ of the primary winding current $i_p$.

At time $t_2$, the end of the turn-off delay time of horizontal output transistor 35, the transistor becomes cut off and prevents collector current from flowing in the transistor. A horizontal retrace pulse voltage is then developed across horizontal deflection winding 31 during the horizontal retrace interval $t_2$-$t_4$. This retrace pulse voltage is applied to flyback transformer winding 30b and causes the primary current $i_p$ to undergo a sinusoidal oscillation, as illustrated in FIG. 2f between times $t_2$-$t_4$. Near the center of the horizontal retrace interval, the positive current $i_p$ has decreased to zero, at which point SCR 65a is commutated out of conduction. The negative portion of the sinusoidal current $i_p$ then flows in diode 65b, reaching a negative value of peak magnitude $I_{P2}$ at time $t_4$.

Because energy is transferred during the retrace interval to load circuits such as the ultor load coupled to terminal U through a diode 69, the peak magnitude of the primary current $i_p$ at the end of the retrace interval is less than the peak magnitude of the current at the beginning of the retrace interval. During the subsequent trace interval between times $t_4$-$t_5$, the remaining energy stored in flyback transformer 30 is returned to the unregulated input supply 90, as the current $i_p$ decreases to zero in a sawtooth fashion. At time $t_5$, as the primary current $i_p$ attempts to become positive, diode 65b becomes commutated out of conduction, thereby open-circuiting bidirectionally conductive switch 65 until another gating pulse 82 is applied to SCR 65a at time $t_9$.

A resistor 38 and a diode 39 are coupled between start-up supply terminal B and capacitor 37 to charge capacitors 37 and 32 during the start-up interval after closure of ON/OFF switches 14a and 14b. With such an arrangement, retrace pulse voltages are immediately developed in flyback transformer winding 30b and enable SCR 65a of bidirectionally conductive switch 65 to be commutated off during the start-up interval. During steady-state operation, the DC voltage across capacitor 37 reverse biases diode 39 and decouples deflection generator 36 from start-up supply 13.

To regulate the transfer of energy to the flyback transformer coupled load circuits under varying values of the input voltage $V_i$, and under varying loading conditions, the conduction of bidirectionally conductive switch 65 is controlled by means of a regulator control circuit 83 which controls the turn-off delay time of horizontal output transistor 35. By controlling the turn-off delay time of horizontal output transistor 35, and thus controlling the initiation of the horizontal retrace interval, the amount of energy stored in the leakage inductance 67 immediately prior to initiation of the horizontal retrace interval can be controlled, thereby regulating the energy transfer. The degree of magnetic coupling between primary winding 30a and secondary windings 30b-30f is such that sufficient leakage inductance is created to store a substantial amount of the energy required to be transferred from the unregulated input supply. For a television receiver with about 100 watt power consumption, the leakage inductance 67 will typically be on the order of 1 to 5 millihenry.

Regulator control circuit 83 includes a pair of transistors 47 and 48 arranged in Darlington configuration, with the collector of transistor 48 coupled to ground and the emitter of transistor 48 coupled to terminal 16. A resistor 49 is coupled between the base of transistor 47 and terminal 16.

Transistors 47 and 48 act as a shunt across capacitor 45, to discharge the capacitor by an amount determined by the conduction of the two transistors. The conduction of transistors 47 and 48 is controlled by a control voltage applied to the base of transistor 47.

The control voltage may, for example, be representative of a deflection circuit quantity such as an energy level of the deflection and energy supply circuit 10 as determined by the retrace pulse amplitude in flyback transformer winding 30f. The retrace pulse voltage in flyback transformer winding 30f is rectified by a diode 40 and filtered by a capacitor 41. A resistor 42 is provided to slightly discharge capacitor 41. The rectified retrace pulse voltage developed across capacitor 41 is applied as a control voltage to the base of transistor 47 through a zener diode 43 and a resistor 44.

By controlling the magnitude of the voltage $V_c$ across capacitor 45, regulator control circuit 83 controls the base drive voltage $V_b$ applied to transistor 35 and thus controls the turn-off delay time of the transistor to provide the required energy transfer regulation. For example, if the input voltage $V_i$ decreases to a value $V_i'$, the retrace pulse amplitude in winding 30f will also tend to decrease. Transistors 47 and 48 of regulator control circuit 83 respond by becoming more conductive, thereby decreasing the magnitude of the voltage $V_c$ across capacitor 45. As illustrated in FIG. 2b, because the base drive voltage $V_b$ comprises the algebraic sum of the fixed duty cycle, fixed peak-to-peak magnitude AC voltage $V_2$, and the capacitor voltage $V_c$, a decrease in magnitude of the voltage $V_c$ to a magnitude $V_c'$ results in the establishment of a new DC zero level 19 for low-line conditions of a decreased input voltage $V_i'$. The positive portion of the voltage $V_b$ will increase in magnitude to a value $V_{b+}'$, and the negative portion of the voltage $V_b$ will decrease in magnitude to a new value $V_{b-}'$. Such a change in base drive voltage $V_b$ will cause a corresponding change to the base current $i_b$ flowing in the base-emitter electrode of horizontal output transistor 35, as illustrated by the dashed waveform in FIG. 2c.

The increased positive portion $V_{b+}'$ of base drive $V_b$ results in an increased forward base current portion 80' of the base current $i_b$ and the decrease in magnitude of negative portion $V_{b-}'$ of the base drive voltage $V_b$ results in a slower sweep out of the stored charge in the base region of horizontal output transistor 35 after initiation of the negative portion of base drive $V_b$ at time $t_1$. The effects of both the increased forward base current in transistor 35 at time $t_1$ and the reduced magnitude of the negative voltage applied to the base of transistor 35 after time $t_1$ contribute to an increase in the duration of the reverse current portion of the base current $i_b$, as illustrated in FIG. 2c by the dashed waveform portion 81'. The turn-off delay time is thus delayed until time $t_3$, as illustrated in FIG. 2d, permitting the stored energy in leakage inductance 67 at the end of trace to be approximately the same, even at the reduced input voltage $V_i'$, as illustrated in FIG. 2f. The horizontal retrace interval now occurs between times $t_3$–$t_6$, and bidirectionally conductive switch 65 becomes commutated off at time $t_8$.

The turn-on instant of bidirectionally conductive switch 65 occurs at the same fixed instant $t_1$ within each cycle of the alternating current voltage $V_{55}$, substantially independent of the activity of regulator control circuit 83 or the deflection circuit quantity to be controlled, as illustrated in FIG. 2e by the coincident location of gating pulse 82 and the gating pulse 82' generated at low-line.

Regulation of the energy is achieved by controlling the initiation of the horizontal retrace interval by varying the turn-off delay time of the horizontal output transistor 35. To prevent picture distortion, AFPC circuit 54, in a conventional manner, rephases the deflection rate voltage $V_{55}$ relative to the occurrence of sync pulses 56 such that horizontal deflection is maintained in synchronism with the picture and sync information of the composite video signal.

By maintaining a fixed turn-on instant for controllable switch 65, deflection rate voltage $V_{55}$ generated by horizontal oscillator 55 may be used to drive both controllable switch 65 and horizontal output transistor 35. A single transformer T1 may then be used to couple the drive waveforms to the appropriate elements. By controlling the turn-off delay time of the horizontal output transistor 35, no leading edge modulation of the squarewave voltage $V_{55}$ is required. Any conventional horizontal oscillator circuit may then typically be used as the horizontal oscillator block 55 of FIG. 1, including one designed to be fabricated as an integrated circuit or one designed to be constructed with discrete components.

By controlling the turn-off delay time of horizontal output transistor 35, a relatively simple active regulator control circuit 83 may be used, namely a single transistor stage shunting capacitor 45.

Figure 3:
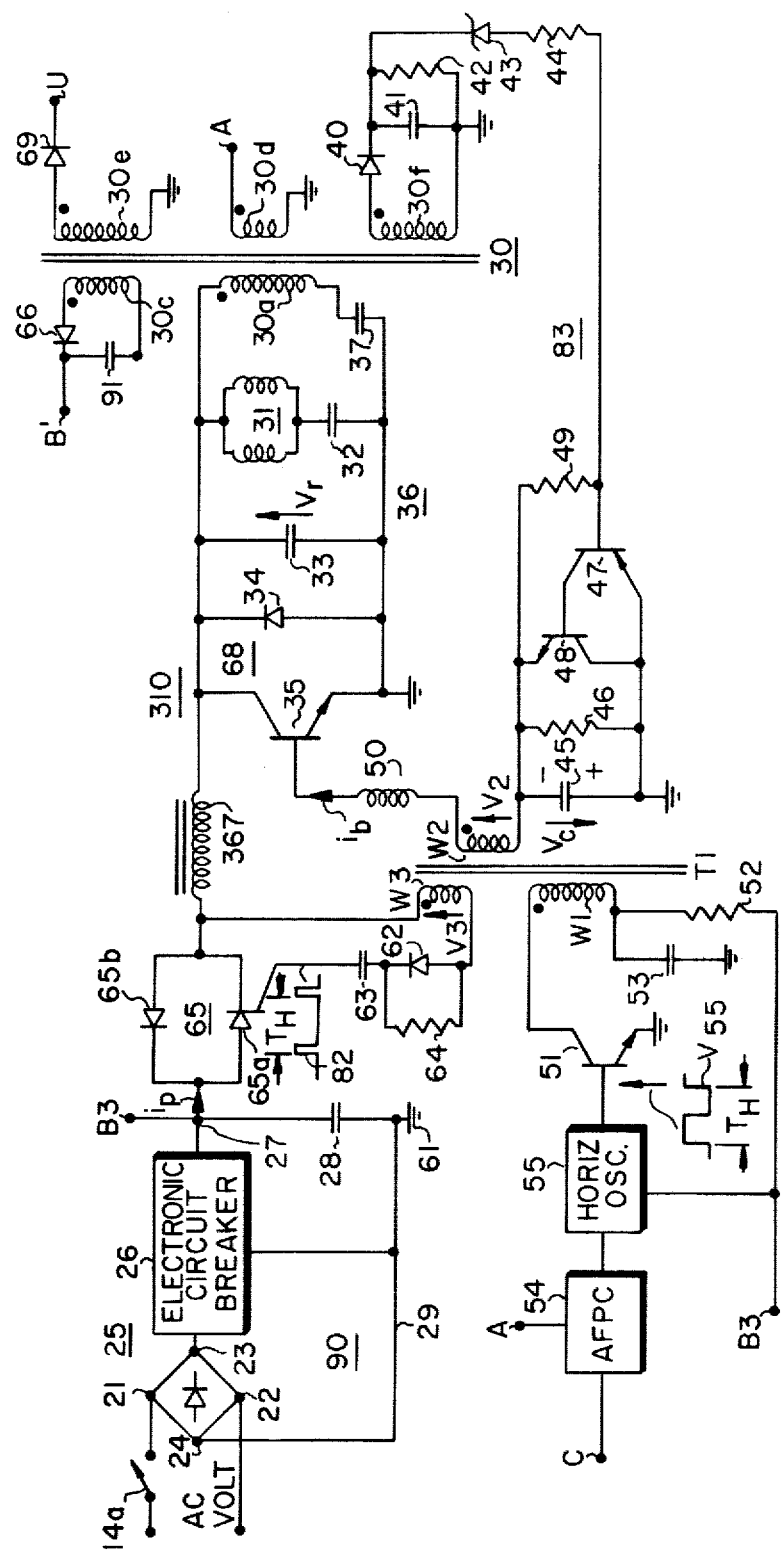
FIG. 3 illustrates another inventive embodiment of a deflection and energy supply circuit.

FIG. 3 illustrates another deflection and energy supply circuit, circuit 310, embodying the invention, wherein the reference or ground terminal 61 for the various flyback transformer coupled load circuits is conductively connected to return conductor 29 of the unregulated input supply. Items in FIGS. 1 and 3 which are identically labelled function similarly or represent similar quantities. The function of the leakage inductance 67 of FIG. 1 is performed by the inductance of an input choke 367 coupled between the cathode of SCR 65a and the collector of horizontal output transistor 35. Flyback transformer 30 of FIG. 3 may then be constructed such that all of the windings of the flyback transformer are magnetically tightly coupled. Start-up supply voltage for horizontal oscillator 55 and the collector supply voltage for driver transistor 51 are provided in FIG. 3 at a B3 terminal coupled to the unregulated input voltage terminal 27.

Operation of the circuit of FIG. 3 is similar to the operation of the circuit of FIG. 1, with waveforms similar to that of FIG. 2 also applicable to the circuit of FIG. 3. During the horizontal trace interval, with trace switch 68 conductive, the collector of horizontal output transistor 35 is substantially at ground potential. At time $t_1$ of FIGS. 2a–2f, upon occurrence of the leading edge of deflection rate waveform $V_{55}$, a gating pulse 82 is applied to the gate of SCR 65a, gating the SCR into conduction. A sawtooth primary current $i_p$ begins to flow from terminal 27 through SCR 65a, inductor 367 and horizontal output transistor 35 to ground, storing energy in the magnetic field of inductor 367. After the lapse of a controllable turn-off delay interval $t_1$–$t_2$, horizontal output transistor 35 is cut off, initiating the horizontal retrace interval, times $t_2$–$t_4$.

Energy is transferred to the various flyback transformer coupled load circuits during the retrace interval. The retrace pulse voltage developed across deflection winding 31 is applied to inductor 367 causing the primary current $i_p$ to undergo one half cycle of oscillation. SCR 65a is commutated out of conduction near the center of the horizontal retrace interval, and diode 65b conducts thereafter until time $t_5$, at which time the diode is also commutated out of conduction.

The transfer of energy is controlled by controlling the initiation of the horizontal retrace interval by varying the turn-off delay time interval. The turn-off delay time interval is varied by varying the voltage $V_c$ across capacitor 45 in response to variations of a feedback voltage coupled to the base of transistor 47 of regulator control circuit 83.

I claim:

1. A deflection and energy supply circuit, comprising:
   a deflection winding;
   a retrace capacitance coupled to said deflection winding;
   a trace switch including transistor switching means coupled to said deflection winding for generating a trace deflection current in said deflection winding when said trace switch is conductive;
   a source of input voltage;
   a load;
   an inductance coupled to said load for transferring energy stored in said inductance to said load;

a controllable switch coupled to said source and to said inductance for applying said input voltage to said inductance to store energy in said inductance, the amount of stored energy in said inductance being controlled by the conduction duration of said controllable switch prior to the initiation of the transferral of said stored energy in said load;

means coupled to said transistor switching means and responsive to a deflection rate signal for generating a base-drive signal to control the base current in said transistor switching means, said base-drive generating means generating a forward biasing portion of said base-drive signal during a first interval within each cycle of said deflection rate signal and generating a reverse biasing portion during a second interval within each cycle of said deflection rate signal to cut off the flow of collector current within said transistor switching means after the lapse of a turn-off delay from the initiation of said reverse biasing portion, said retrace capacitance and said deflection winding forming a resonant retrace circuit upon cutoff of said collector current after the lapse of said turn-off delay applying a retrace pulse voltage to said inductance to initiate the transferral of said stored energy to said load;

means responsive to said deflection rate signal for turning on said controllable switch within each deflection cycle; and means coupled to said base-drive generating means and responsive to variations of a deflection circuit quantity for varying said turn-off delay in response to variations of said deflection circuit quantity in order to alter the transferral of said stored energy as said deflection circuit quantity varies.

2. A circuit according to claim 1 wherein said base-drive generating means includes a driver transformer with first and second windings, said deflection rate signal being applied to said driver transformer first winding, an AC component of said base-drive signal being developed across said driver transformer second winding.

3. A circuit according to claim 2 wherein said controllable switch turn-on means comprises a third winding of said driver transformer coupled to a control terminal of said controllable switch for applying a turn-on signal to said controllable switch initiated simultaneously with the initiation of said forward biasing portion of said base-drive signal.

4. A circuit according to claim 2 wherein said turn-off delay varying means includes means coupled to said driver transformer second winding for developing a DC component of said base-drive signal representative of said deflection circuit quantity variations.

5. A circuit according to claim 4 wherein said DC component developing means comprises a capacitor series coupled with said driver transformer second winding and a base-emitter diode of said transistor switching means, said base-emitter diode rectifying one polarity of said AC component of said base-drive signal.

6. A circuit according to claim 1 wherein said inductance includes a flyback transformer with first and second windings, said flyback transformer first winding coupled to said controllable switch, said flyback transformer second winding coupled to said load circuit.

7. A circuit according to claim 6 wherein said flyback transformer first winding is magnetically loosely coupled with said flyback transformer second winding to create sufficient leakage inductance to store at least a substantial amount of the energy transferred in said leakage inductance.

8. A circuit according to claims 6 or 7 wherein said controllable switch is bidirectionally conductive, including a controllable semiconductor poled to conduct a forward current from said source of input voltage and a second switch poled to conduct return current to said source of input voltage.

9. A circuit according to claim 8 wherein said controllable semiconductor is turned on each deflection cycle when said trace switch is conductive, said retrace pulse voltage turning off said controllable semiconductor.

10. A regulated deflection circuit, comprising:
a deflection winding;
a retrace capacitance coupled to said deflection winding;
a trace switch coupled to said deflection winding for generating a sawtooth deflection current when said trace switch is conductive, said trace switch including an input terminal for controlling a main conduction path of said trace switch;
a source of energy;
a load;
an inductance coupled to said load;
means coupled to said source of energy and to said inductance for storing energy in said inductance when said main conduction path of said trace switch is conductive, said deflection winding and retrace capacitance forming a resonant retrace circuit upon cutoff of said main conduction path applying a retrace pulse voltage to said inductance to transfer energy stored in said inductance to said load;
a regulator control circuit responsive to variations of a deflection circuit quantity for developing a control signal representative of said variations; and
a driver stage coupled to said regulator control circuit and to the input terminal of said trace switch and responsive to said control signal and a deflection rate signal for applying a switching signal to said input terminal, said switching signal making said main conduction path conductive at an instant within each cycle of said deflection rate signal that is substantially independent of the variations of said deflection circuit quantity, said switching signal varying the cutoff instant of said main conduction path with control signal changes in order to alter the transfer of energy stored in said inductance as said deflection circuit quantity varies.

* * * * *